(12) United States Patent
Yoshida et al.

(10) Patent No.: US 12,048,093 B2
(45) Date of Patent: Jul. 23, 2024

(54) FLEXIBLE WIRING BOARD, MANUFACTURING METHOD, ELECTRONIC MODULE, ELECTRONIC UNIT, AND ELECTRONIC APPARATUS

(71) Applicant: CANON KABUSHIKI KAISHA, Tokyo (JP)

(72) Inventors: Toshiyuki Yoshida, Kanagawa (JP); Yu Ogawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 93 days.

(21) Appl. No.: 17/877,729

(22) Filed: Jul. 29, 2022

(65) Prior Publication Data

US 2023/0036379 A1    Feb. 2, 2023

(30) Foreign Application Priority Data

Jul. 30, 2021 (JP) ................................. 2021-125005
May 19, 2022 (JP) ................................. 2022-082416

(51) Int. Cl.
*H05K 1/18* (2006.01)
*H05K 1/02* (2006.01)
*H05K 1/14* (2006.01)

(52) U.S. Cl.
CPC .......... *H05K 1/0296* (2013.01); *H05K 1/028* (2013.01); *H05K 1/14* (2013.01); *H05K 1/18* (2013.01); *H05K 2201/10151* (2013.01)

(58) Field of Classification Search
CPC ........ H05K 1/0296; H05K 1/028; H05K 1/14; H05K 1/18; H05K 2201/10151

USPC ......................................................... 361/749
See application file for complete search history.

(56) References Cited

U.S. PATENT DOCUMENTS

| | | | |
|---|---|---|---|
| 2011/0279189 A1* | 11/2011 | Umeda | H05K 1/0245 333/5 |
| 2013/0313013 A1* | 11/2013 | Porta | H05K 1/0225 174/268 |
| 2021/0185798 A1 | 6/2021 | Yoshida | |

FOREIGN PATENT DOCUMENTS

| | | |
|---|---|---|
| JP | 2000077802 A | 3/2000 |
| JP | 2012227211 A | 11/2012 |
| JP | 2021-093507 A | 6/2021 |

\* cited by examiner

*Primary Examiner* — Binh B Tran
(74) *Attorney, Agent, or Firm* — Canon U.S.A., Inc. IP Division

(57) ABSTRACT

A flexible wiring board includes a signal line and a conductive portion that overlaps the signal line in plan view. The conductive portion includes a first line portion extending in a first direction and having a first part and a second part, a second line portion extending in a second direction and having a third part and a fourth part, and a third line portion. The third line portion has a line width smaller than a line width of the first part and a line width of the second part, is connected to the first and second parts, and is provided between the first part and the second part. The conductive portion includes a fourth line portion that is connected to the third part and the fourth part and that is provided between the third part and the fourth part. The third line portion and the fourth line portion intersect.

25 Claims, 9 Drawing Sheets

FIG. 8

|  |  | EXAMPLE 1 | EXAMPLE 2 | COMPARATIVE EXAMPLE 1 |
|---|---|---|---|---|
| OPENING RATIO | % | 82% | 81% | 78% |
| L1 | mm | 2.1 | 2.2 | 2.1 |
| L2 | mm | 0.5 | 0.5 | 0.5 |
| W1 | μm | 35 | 30 | 65 |
| W2 | μm | 65 | 65 | 65 |
| θ | deg | 3 | 3 | 3 |
| BENDING LOAD | RESULT | 108 mN | 105 mN | 145 mN |
|  | EVALUATION | A | A | C |
| OPENING AMPLITUDE | RESULT | 140 mV | 145 mV | 121 mV |
|  | EVALUATION | A | A | C |

FLEXIBLE WIRING BOARD, MANUFACTURING METHOD, ELECTRONIC MODULE, ELECTRONIC UNIT, AND ELECTRONIC APPARATUS

BACKGROUND

Field

The present disclosure relates to a flexible wiring board.

Description of the Related Art

A flexible wiring board is used as a signal transmission path in electronic apparatuses, such as a mobile phone, a smartphone, a tablet terminal, and a digital camera. The flexible wiring board includes a conductive portion in addition to a signal line in order to improve an electrical function and/or a mechanical function.

Japanese Patent Laid-Open No. 2021-093507 discloses a wiring substrate including a ground layer that faces a differential signal line and that has an opening portion including a plurality of openings that are continuously arranged in a predetermined direction.

There exist conventional flexible printed wiring boards that, when a ground layer in which a conductive portion as a non-opening portion has a mesh pattern, flexibility of the flexible printed wiring board may be impaired.

SUMMARY

The present disclosure provides a flexible wiring board having improved functionality.

According to an aspect of the present disclosure, a flexible wiring board includes a signal line, and a conductive portion that overlaps the signal line in plan view and includes a first line portion that extends in a first direction, and a second line portion that extends in a second direction intersecting the first direction, wherein the first line portion includes a first part and a second part, wherein the conductive portion includes a third line portion that has a line width smaller than a line width of the first part and a line width of the second part, that is connected to the first part and the second part, and that is provided between the first part and the second part, wherein the second line portion includes a third part and a fourth part, wherein the conductive portion includes a fourth line portion that is connected to the third part and the fourth part and that is provided between the third part and the fourth part, and wherein the third line portion and the fourth line portion intersect.

Further features of the present disclosure will become apparent from the following description of exemplary embodiments with reference to the attached drawings.

BRIEF DESCRIPTION OF THE DRAWINGS

FIG. 8 is a table showing the evaluation results of Examples 1 and 2 and Comparative Example 1.

DESCRIPTION OF THE EMBODIMENTS

Hereafter, embodiments of the present disclosure will be described with reference to the drawings. The embodiments described below are each an embodiment of the disclosure, and the disclosure is not limited to these. Elements common to the embodiments will be described with reference to a plurality of drawings, and descriptions of elements that are denoted by the same numerals will be omitted as appropriate. Different items having the same name will be discriminated from each other by referring to the items as "a first item", "a second item", and the like.

First Embodiment

Figure 1A:
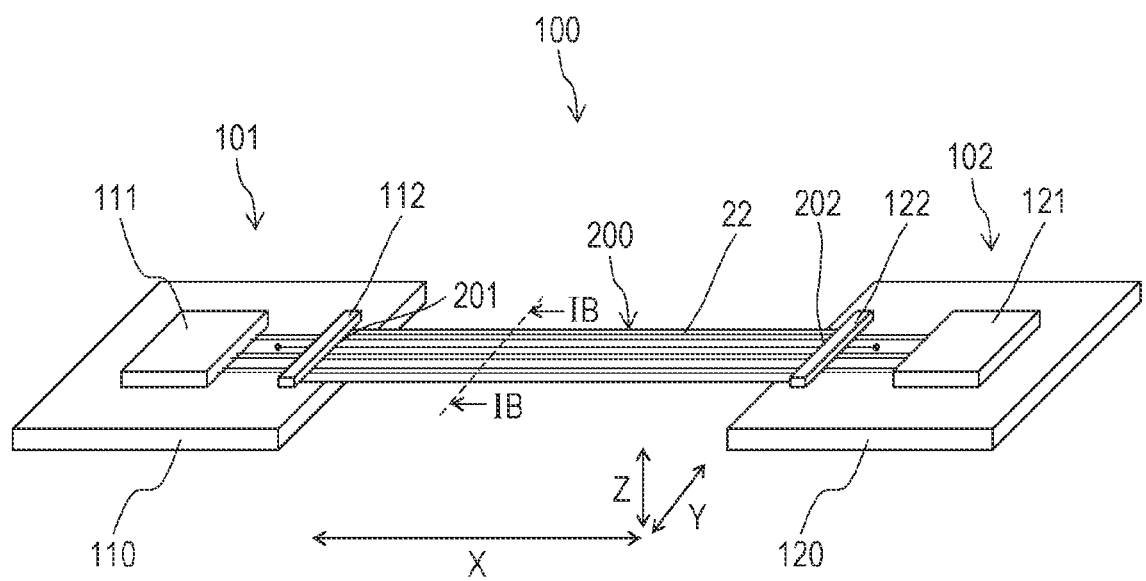
FIG. 1A is a perspective view of a unit according to the present embodiment.

FIG. 1A is a perspective view of an electronic unit 100 including a wiring board 200. The wiring board 200 is, for example, a flexible printed wiring board. A method of forming wiring in the wiring board 200 is not limited to printing. The wiring may be pre-formed wires. The wiring board 200 may be a flat cable.

The electronic unit 100 includes a circuit board 101, a circuit board 102, and the wiring board 200 that electrically connects the circuit board 101 and the circuit board 102. The circuit board 101 and the circuit board 102 are, for example, printed circuit boards. The term "electronic module" may refer to a module in which the wiring board 200 and at least one of the circuit board 101 and the circuit board 102 are connected to each other. The electronic unit 100 can be formed, for example, by preparing an electronic module in which the wiring board 200 is connected to the circuit board 101 and by connecting the wiring board 200 of the electronic module further to the circuit board 102. Moreover, it is possible to form an electronic apparatus including the electronic unit 100.

As illustrated in FIG. 1A, the wiring board 200 extends in the X direction, which is the longitudinal direction. The wiring board 200 includes a plurality of signal lines 22, each of which extends in the X direction. The plurality of signal lines 22 are disposed at intervals in the Y direction that is perpendicular to the X direction and that is the transversal direction. The Z direction that is perpendicular to the X direction and the Y direction is the thickness direction of the wiring board 200. The wiring board 200 has flexibility and can be deformed to be bent.

The wiring board 200 has an end 201 that is an example of an end portion in the X direction and an end 202 that is an example of an end portion in the X direction. In the wiring board 200, the end 202 is positioned on a side opposite to the end 201.

A connector 112 is mounted on a wiring board 110. The connector 112 is a conductor that is included in the wiring board 110 and that is electrically connected to a semiconductor device 111. The end 201 of the wiring board 200 is attached to the connector 112. Thus, the end 201 of the wiring board 200 is electrically and mechanically connected to the wiring board 110.

As with the wiring board 110, a connector 122 is mounted on a wiring board 120. The connector 122 is a conductor that is included in the wiring board 120 and that is electrically connected to a semiconductor device 121. The end 202 of the wiring board 200 is attached to the connector 122. Thus, the end 202 of the wiring board 200 is electrically and mechanically connected to the wiring board 120. The wiring board 110 and the wiring board 120 are, for example, rigid wiring boards. The wiring board 110 and the wiring board 120, as rigid wiring boards, may include resin substrates or ceramic substrates, and may be printed wiring boards (rigid printed wiring boards).

With the above configuration, the semiconductor device 111 and the semiconductor device 121 are electrically connected so as to be communicable with each other via the wiring board 110, the wiring board 200, and the wiring board 120. At this time, the wiring board 200 may be soldered to the wiring boards 110 and 120 directly, not via the connectors 112 and 122. In the present embodiment, the wiring board 200 is soldered to the wiring board 110 directly, and the wiring board 200 is connected to the wiring board 120 via a connector.

Figure 1B:
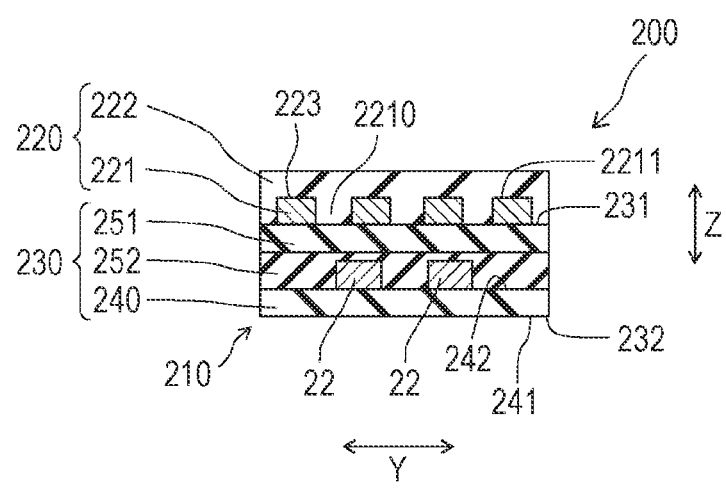
FIG. 1B is a sectional view of a wiring board taken along line IB-IB of FIG. 1A.

FIG. 1B is a sectional view of the wiring board 200 taken along line IB-IB of FIG. 1A. As illustrated in FIG. 1B, the wiring board 200 includes a wiring board body 210 and a shield member 220.

The wiring board body 210 includes an insulator portion 230 and the aforementioned plurality of signal lines 22. The insulator portion 230 is made of a material having electrically insulating properties. Each signal line 22 is made of a material having electroconductivity. The wiring board body 210, including the insulator portion 230 and the plurality of signal lines 22, extends in the X direction. The plurality of signal lines 22 are disposed inside of the insulator portion 230 at intervals in the Y direction. However, the plurality of signal lines 22 need not be disposed inside of the insulator portion 230. Although two of the plurality of signal lines 22 are illustrated in FIG. 1B, the number of signal lines in the present embodiment is not limited to two, and may be three or more. The insulator portion 230 has a sheet-like shape, and has a pair of main surfaces 231 and 232 extending in the X direction. The shield member 220 may be disposed at a position where the shield member 220 is in contact with any one of the pair of main surfaces 231 and 232. In the present embodiment, the shield member 220 is disposed at a position where the shield member 220 is in contact with the main surface 231. The shield member 220 may be disposed on each of the pair of main surfaces 231 and 232.

The insulator portion 230 includes a plurality of insulating layers 240, 251, and 252. The plurality of insulating layers 240, 251, and 252 are in contact with each other. The insulating layer 240 is an insulating substrate, and has a pair of main surfaces 241 and 242. The plurality of signal lines 22 are disposed on the main surface 242. The insulating layer 251 is disposed above the main surface 242 and above the plurality of signal lines 22.

In the present embodiment, the insulator portion 230 includes the insulating layer 252 disposed between the insulating layer 240 and the insulating layer 251. The insulating layer 252 has a function of bonding the insulating layer 240 and the insulating layer 251. Provided that the insulating layer 251 has a bonding function, the insulating layer 252 may be omitted.

Hereafter, each signal line 22 will be described in detail. Each signal line 22 is a line that can be used to transmit a digital data signal. As the amount of signals to be transmitted has increased, it is desirable to configure a differential signal line in which a pair of the plurality of signal lines 22 forms one set. The plurality of signal lines 22 may include a line that transmits a single-end signal such as a control signal or a response signal. The wiring board 200 may include a ground line (not shown), in addition to the signal lines 22.

A method of forming the signal lines 22 is not particularly limited. For example, the signal lines 22 can be formed by using a method such as affixing of metal foils, metal plating, an inkjet process, or the like. In a case where copper foils are used as metal foils, by using a film in which the copper foils are affixed with an adhesive, it is possible to form a necessary transmission line pattern by performing a photolithography-and-etching process. In a case where an inkjet process is used, it is possible to form a necessary pattern by forming a pattern by using a polymer ink including metal particles and by firing the pattern at a temperature lower than or equal to the glass-transition point (Tg) of the insulating layer 240.

The thickness of the signal lines 22, which is not particularly limited, is preferably, for example, 0.1 μm or more and 20 μm or less.

Hereafter, the shield member 220 will be described in detail. The shield member 220 is a sheet-shaped member, and includes: a conductive layer 221 including a conductive portion 223, and an insulating layer 222 in which the conductive portion 223 is provided. The conductive portion 223 is disposed at a position where the conductive portion 223 is in contact with the main surface 231 of the insulator portion 230. At least, the conductive portion 223 may be disposed at a position where the conductive portion 223 faces the signal lines 22 or overlaps the signal lines 22 in plan view. The conductive portion 223 and the conductive layer 221 are provided inside of the insulating layer 222. The conductive layer 221 has electroconductivity, and may be a shield layer that blocks electromagnetic noise. The insulating layer 222 is a protective layer that surrounds the conductive layer 221 so that the conductive layer 221 may not come into contact with a member around the wiring board 200, and is composed of a member having electrically insulating properties.

Parts of the conductive portion 223 are disposed at intervals in the Y direction, and an opening portion 2210 is formed between the parts of the conductive portion 223. The opening portion 2210 will be described in detail with reference to FIG. 2A.

The conductive portion 223 is formed in a mesh pattern, and the opening portion 2210 is a gap in which the conductive portion 223 is not formed. By forming the conductive portion 223 in a mesh pattern, it is possible to reduce transmission error of a digital signal transmitted through the signal lines 22, compared with a configuration such that the conductive portion 223 is not formed in a mesh pattern. The conductive layer 221 need not be a shield layer. A method of forming the conductive portion 223 is not particularly limited. The conductive portion 223 can be directly patterned on the wiring board body 210 by using any appropriate printing method such as screen printing or inkjet printing. Alternatively, an electroconductive film may be patterned on the wiring board body 210 by performing a photolithography-and-etching process. The conductive portion 223 may be formed beforehand in a predetermined shape by die cutting or mesh making and may be affixed to the wiring board body 210.

Although the conductive layer 221 need not be electrically connected to any member, in the present embodiment, the conductive layer 221 is used as a path of a return electric current of a signal that passes through the signal lines 22, and is a part of a ground line. That is, the conductive layer 221 is electrically connected to the ground lines of the wiring boards 110 and 120.

Because the wiring board 200 includes the conductive layer 221, it is possible to reliably obtain a shielding effect against electromagnetic noise emitted from the wiring board 200 and exogenous electromagnetic noise transmitted to the wiring board 200. The insulating layer 222 is provided on the conductive layer 221.

For example, a conductive layer can have a shielding function when a fixed electric potential is supplied to the conductive layer. The term "shield layer" may refer to a conductive layer having a shielding function. The fixed potential supplied to a shield layer is, for example, a power source potential or a grounded potential. However, the fixed potential is not limited to any of these. The term "ground layer" may refer to a conductive layer to which a grounded potential is supplied.

Figure 2A:
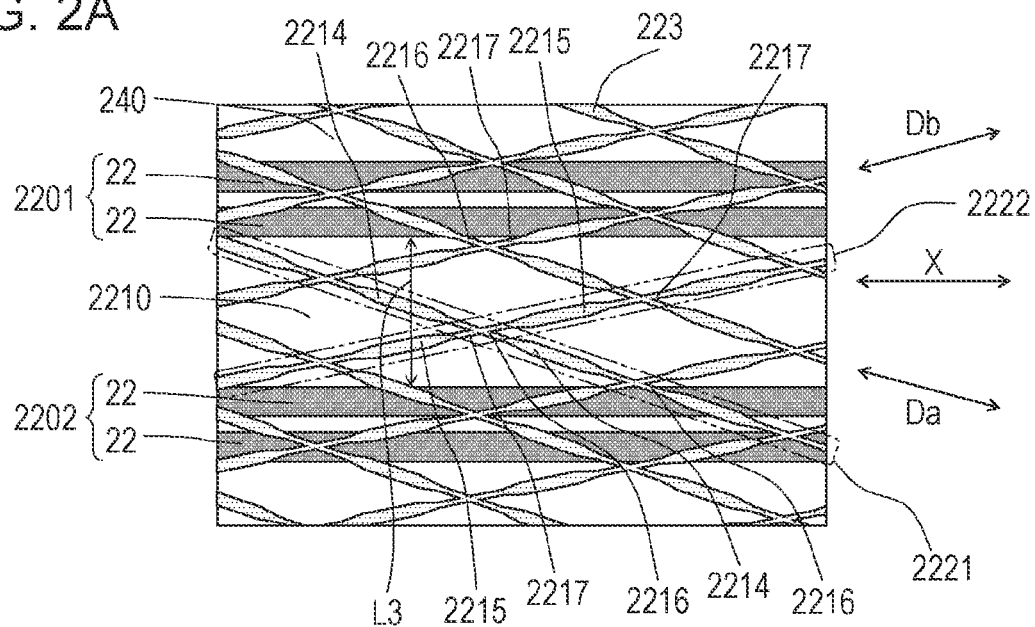
FIG. 2A illustrates a wiring board as seen from the main surface side of a conductive layer according to a first embodiment.
Figure 2B:
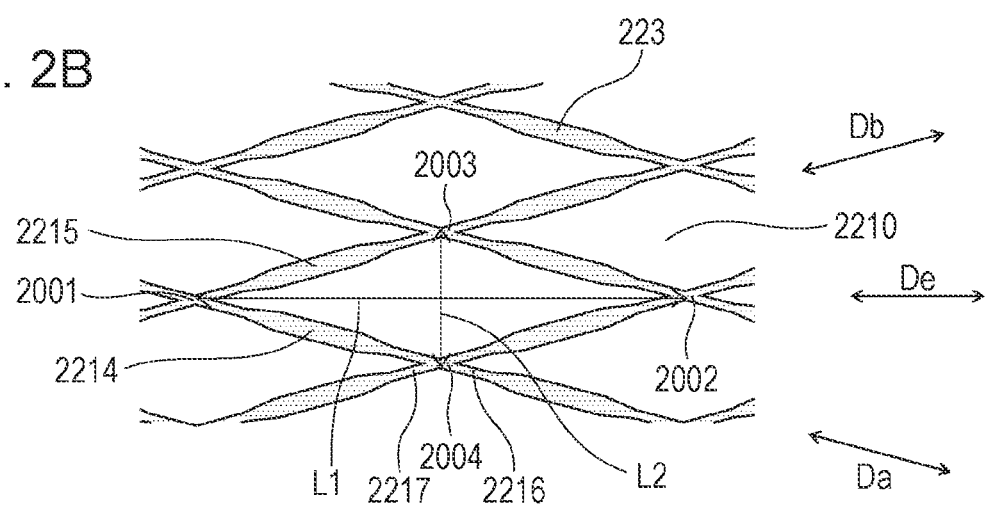
FIG. 2B illustrates only the conductive layer of FIG. 2A.
Figure 2C:
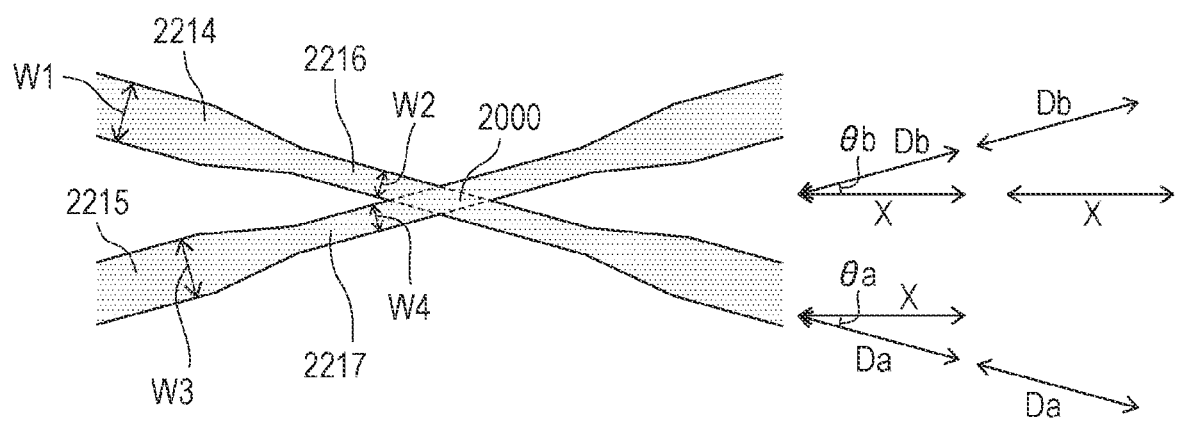
FIG. 2C is an enlarged view of only an intersecting part of the conductive layer of FIG. 2B.

FIG. 2A is a see-through view of the wiring board 200 according to the present embodiment as seen from the main surface 231 side of the insulator portion 230, illustrating only the insulating layer 240, the signal lines 22, and the conductive portion 223. FIG. 2B illustrates only the conductive portion 223 according to the present embodiment. FIG. 2C is an enlarged view of at least a part of the conductive portion 223 according to the present embodiment.

As illustrated in FIG. 2A, in order to reliably obtain high signal-transmission performance and flexibility, the conductive portion 223 includes a thick-line portion 2214, which extends in a Da direction intersecting the X direction in which the signal lines 22 extend, and a thick-line portion 2215, which extends in a Db direction intersecting the Da direction. The thick-line portion 2214 is connected to a thin line portion 2216 whose line width is smaller than that of the thick-line portion 2214, and the thick-line portion 2215 is connected to a thin line portion 2217 whose line width is smaller than that of the thick-line portion 2215. Here, the thick-line portion 2214 is a first line portion, the thick-line portion 2215 is a second line portion, the thin line portion 2216 is a third line portion, and the thin line portion 2217 is a fourth line portion. In the present embodiment, the thin line portion 2216 extends in the Da direction, and the thin line portion 2217 extends in the Db direction.

A linear portion 2221, which is a part of the conductive portion 223 extending in the Da direction, includes the thick-line portions 2214 and the thin line portions 2216 that are alternately arranged. A plurality of the linear portions 2221, each extending in the Da direction, are arranged in the Db direction. A linear portion 2222, which is a part of the conductive portion 223 extending in the Db direction, includes the thick-line portions 2215 and the thin line portions 2217 that are alternately arranged. A plurality of the linear portions 2222, each extending in the Db direction, are arranged in the Da direction. The conductive portion 223 having a mesh pattern is formed because the plurality of linear portion 2221, each extending in the Da direction, and the plurality of linear portion 2222, each extending in the Db direction, intersect at a plurality positions in the thin line portions 2216 and the thin line portions 2217.

The conductive portion 223 has a mesh pattern that is formed because the thin line portions 2216 and the thin line portions 2217 intersect at a plurality of positions, and the opening portions 2210 are disposed in a matrix pattern. In the present embodiment, the Da direction intersects the X direction. However, the Da direction need not intersect the X direction, and the Da direction and the Db direction may be parallel to the X direction. The thick-line portions 2214 and the thick-line portions 2215 are each disposed at intervals in the Y direction. The interval between the thick-line portions 2214 may be the same as or different from the interval between the thick-line portions 2215.

The opening portions 2210 are parts of the conductive layer 221 in which the conductive portion 223 is not present. The conductive layer 221 includes the conductive portion 223 and the opening portions 2210. The proportion of the area of the opening portions 2210 per unit area when the conductive layer 221 is seen from the main surface 231 side of the insulator portion 230 is the opening ratio of the conductive layer 221. In a unit area, a part of the conductive portion 223 and a part of a plurality of the opening portions 2210 are included.

The opening ratio of the conductive layer 221 is preferably 40% or more and 95% or less. When the opening ratio of the conductive layer 221 is 40% or more, it is possible to make the opening amplitude value of an eye pattern in signal transmission sufficiently large, and it is possible to reduce transmission error of a digital signal transmitted through the signal lines 22. When the opening ratio of the conductive layer 221 is 95% or less, it is possible to sufficiently block electromagnetic noise. Thus, it is possible to effectively reduce electromagnetic noise emitted from the signal lines 22, that is, the wiring board 200. That is, it is possible to effectively reduce electromagnetic noise that may affect wireless communication. In view of the above, the opening ratio of the conductive layer 221 is more preferably 50% or more and 90% or less.

In the present embodiment, all parts of the linear portions 2221 whose line width is smaller than that of the thick-line portion 2214 are defined as the thin line portions 2216. However, each the thin line portions 2216 may be referred to as a first thin line portion 2216 or a second thin line portion 2216. All parts of the linear portion 2222 whose line width is smaller than that of the thick-line portion 2215 is defined as the thin line portions 2217. However, each of the thin line portions 2217 may be referred to as a first thin line portion 2217 or a second thin line portion 2217. The linear portion 2221 may be defined as a first linear portion, and the linear portion 2222 may be defined as a second linear portion.

As illustrated in FIG. 2B, in each opening portion 2210, a first center point 2001 where the first thin line portion 2216 and the first thin line portion 2217 intersect is present. A first line segment L1 that extends across the opening portion 2210 and that connects the first center point 2001 and a second center point 2002 where the second thin line portion 2216 and the second thin line portion 2217 intersect is present. A second line segment L2 that connects a third center point 2003 where a third thin line portion 2216 and a fourth thin line portion 2217 intersect, that extends across the opening portion 2210, and that connects the third center point 2003 and a fourth center point 2004 where a fourth thin line portion 2216 and a fourth thin line portion 2217 intersect is present.

The second line segment L2 is a line segment that intersects the first line segment L1 and whose length is smaller than that of the first line segment L1. The length of the first line segment L1 is preferably 1.5 times or more of the length of the second line segment L2. The length of the first line segment L1 is preferably 1 mm or more, and is preferably 5 mm or less. When the length of the first line segment L1 is 1 mm or more or 5 mm or less, the effect of blocking electromagnetic noise emitted from the signal lines 22, that is, the wiring board 200 is high. Thus, it is possible to effectively reduce electromagnetic noise that may affect wireless communication. In view of the above, the length of the first line segment L1 is preferably 1 mm or more and 5 mm or less.

In a case where two signal lines 22 are one set of differential signal lines, the length of the second line segment L2 of each opening portion 2210 is preferably smaller than the distance L3 between a first differential signal line 2201 and a second differential signal line 2202 adjacent to the first differential signal line 2201. Here, the distance between the first differential signal line 2201 and the second differential signal line 2202 is the distance between a differential signal line of the first differential signal line 2201 on the second differential signal line 2202 side and a differential signal line of the second differential signal line 2202 on the first differential signal line 2201 side. Thus, it is possible to suppress generation of cross-talk noise between two sets of differential signal lines, and it is possible to suppress occurrence of signal transmission error.

As illustrated in FIG. 2C, the conductive portion 223 includes the thick-line portion 2214 that extends in the Da direction, and the thick-line portion 2215 that extends in the Db direction intersecting the Da direction and the X direction. The conductive portion 223 includes the thin line portion 2216 and the thin line portion 2217 whose line width is smaller than that of the thick-line portion 2214 and the thick-line portion 2215. The thick-line portion 2214 and the thick-line portion 2215 are connected to the thin line portion 2216 and the thin line portion 2217. Because the thin line portion 2216 and the thin line portion 2217 whose line width is small intersect, the flexibility of the wiring board 200 can be improved. If the conductive portion 223 is composed of only the thick-line portion 2214 and the thick-line portion 2215, the thick-line portion 2214 and the thick-line portion 2215 intersect. When the thick-line portions intersect, the area of an intersecting region is large.

In contrast, when the thin line portions intersect each other, the area of an intersecting region is small, and it is possible to improve flexibility within a range such that transmission error does not occur. By forming the conductive portion 223 in a mesh pattern and causing the thin line portions to intersect each other, it is possible to improve the flexibility of the wiring board 200 while reducing transmission error of a digital signal transmitted through the signal lines 22. That is, it is possible to improve the functionality of the wiring board 200.

Here, the intersecting region is an intersecting region 2000 surrounded by the dotted line in FIG. 2C.

At this time, the line widths W1 and W3 of the thick-line portion 2214 and the thick-line portion 2215, which are not particularly limited, are preferably 50 µm or more and 200 µm or less. When W1 and W3 are 50 µm or more, an electromagnetic noise suppression effect in a higher frequency band is obtained, and it is possible to suppress malfunctioning of surrounding semiconductor devices. When W1 and W3 are 200 µm or less, it is possible to make the area over which the conductive portion 223 covers the signal lines 22 uniform with respect the X direction in which each signal line 22 extends. Therefore, variation in impedance between the signal lines 22 can be suppressed, and therefore it is possible to reduce transmission error of a transmitted digital signal.

The line widths W2 and W4 of the thin line portion 2216 and the thin line portion 2217, which are not particularly limited, are preferably 10 µm or more and less than 50 µm. When W2 and W4 are 10 µm or more, it is possible to make the electric conductivity of the conductive layer 221 sufficiently high, and therefore it is possible to make the opening amplitude value of an eye pattern in signal transmission sufficiently large, and it is possible to reduce transmission error of a digital signal transmitted through the signal lines 22. When W2 and W4 are 50 µm or less, it is possible to reduce the area of the intersecting region 2000 where the thin line portion 2216 and the thin line portion 2217 intersect within a range such that transmission error does not occur, and therefore it is possible to reliably obtain higher flexibility.

In view of the above, the line widths W2 and W4 of the thin line portion 2216 and the thin line portion 2217 are more preferably 15 µm or more and 40 µm or less.

However, provided that the line widths W2 and W4 are smaller than W1 and W3, the line widths W2 and W4 are not limited to the aforementioned range.

The acute angle θa between the Da direction and the X direction is preferably greater than 0 degrees and smaller than the acute angle between a De direction, in which the first line segment L1 extends, and the Da direction. The acute angle θb between the Db direction and the X direction is preferably greater than 0 degrees and smaller than the acute angle between the De direction, in which the first line segment L1 extends, and the Db direction. The acute angles θa and θb are more preferably greater than 0 degrees and smaller than ½ of the acute angle between the De direction, in which the first line segment L1 extends, and the Da direction or ½ of the acute angle between the De direction and the Db direction. The acute angles θa and θb may be the same as or different from each other.

That is, the X direction and the De direction are preferably different directions. Thus, it is possible to suppress variation in impedance between the signal lines 22, and therefore it is possible to reduce transmission error of a transmitted digital signal. However, the X direction and the De direction may be the same direction.

A method of forming the conductive layer 221 is not particularly limited. Examples of the method of forming the conductive layer 221 on the main surface 231 of the insulator portion 230 include: a subtractive method, an electroless-plating method, an electroplating method, and a physical vapor deposition method such as a vacuum deposition method or a sputtering method. Known coating methods such as bar coating, slit coating, and screen printing may be used. Among these methods, as a method of forming the patterned conductive layer 221 on the main surface 231 of the insulator portion 230, screen printing in which an electroconductive material is formed as a coating in a pattern under normal temperature and pressure and is heated to form a dry coating is preferable.

Examples of the material of the conductive layer 221 include: a metal material such as gold, silver, copper, aluminum, or nickel; an electroconductive resin in which electroconductive filler such as metal particles, metal fiber, or carbon nanotube is mixed in a resin; and an electroconductive polymer such as polythiophene or polypyrrole. Among these, as a material for forming a coating, a silver paste that is composed of silver particles having particularly high electroconductivity and a resin binder is preferable. Besides a silver paste, a gold paste, a copper paste, a carbon paste or the like may be used.

In a case where a silver paste is used to form the conductive layer 221, the viscosity of the silver paste is preferably 1 Pa·s or more and 500 Pa·s or less, when the shear velocity is 10/s. When the viscosity of the silver paste is 1 Pa·s or more, the line width of the conductive portion 223 does not change after being formed, and it is possible to obtain the conductive layer 221 having stable quality. When the viscosity of the silver paste is 500 Pa·s or less, it is possible to form the conductive portion 223 while preventing a line of the conductive portion 223 from being broken. In view of the above, the viscosity of the silver paste is more preferably in the range of 5 to 100 Pa·s, when the shear velocity is 10/s.

In a case where the conductive layer 221 is formed by screen printing, when a paste material is supplied to the intersecting region 2000, excessive paste material may be supped depending on the size of the intersecting region 2000. Because the insulating layer 222 is provided in a region to which excessive paste material is supplied, the thickness of the wiring board 200 is increased. However, in the present embodiment, the thick-line portion 2214 and the thick-line portion 2215 are formed, the thin line portion 2216 and the thin line portion 2217 are formed, and the intersecting region 2000 where the thin line portion 2216 and the thin line portion 2217 intersect is formed. Thus, it is possible to reduce the paste supply amount by forming the thin line portion 2216 and the thin line portion 2217 near the intersecting region 2000 between forming of the thick-line portion 2214 and the thick-line portion 2215 and forming of the intersecting region 2000. That is, by forming the intersecting region 2000 after reducing the paste supply amount, it is possible to form the intersecting region 2000 while maintaining the paste supply amount to be small. Thus, it is possible to form the flat conductive layer 221 without supplying an excessive amount of paste to the intersecting region 2000, and it is possible to improve the flexibility of the wiring board 200 in a range such that transmission characteristics are not affected.

In the present embodiment, the thick-line portion 2214, the thick-line portion 2215, the thin line portion 2216, and the thin line portion 2217 are simultaneously formed by screen printing.

In view of electromagnetic-noise blocking ability, the electric resistivity of the conductive layer 221 is preferably $1 \times 10$ Ω·cm or less, and more preferably, $1 \times 10^{-5}$ Ω·cm or less.

The thickness of the conductive layer 221 in the Z direction is preferably in the range of 1 μm or more and 20 μm or less. When the thickness is 1 μm or more, the electric resistivity of the conductive layer 221 can be made sufficiently large. Therefore, it is possible to make the opening amplitude value of an eye pattern in signal transmission sufficiently large, and it is possible to reduce transmission error of a digital signal transmitted through the signal lines 22. When the thickness is 20 μm or less, because the thickness of the insulating layer 222 can also be reduced, it is possible to provide a wiring substrate having higher flexibility. In view of the above, the thickness of the conductive layer 221 in the Z direction is more preferably 2 μm or more and 15 μm or less.

Hereafter, the insulating layer 240, the insulating layer 251, the insulating layer 252, and the insulating layer 222 will be described in detail.

The insulating layer 240 will be described in detail. The material of the insulating layer 240, which is an insulating substrate, is preferably a resin. Examples of the resin include: a polyimide resin such as polyimide, polyamide, or polyamide-imide; a thermosetting resin such as epoxy; and a thermoplastic resin such as a liquid-crystal polymer. Among these, polyimide or a liquid-crystal polymer is preferable. Polyimide has high heat resistance and good mechanical characteristics, and is commercially available easily. Moreover, a liquid crystal has a low relative dielectric constant and thus is suitable for transmitting high-speed signal, and has low hygroscopicity and thus has high dimensional stability.

The thickness of the insulating layer 240 in the Z direction is preferably, for example, 10 μm or more and 100 μm or less. When the thickness of the insulating layer 240 in the Z direction is 10 μm or more, the signal lines 22 can be separated from surrounding electronic components by a sufficient separation distance, and it is possible to suppress the characteristic impedance of the signal lines 22 from being changed. When the thickness of the insulating layer 240 in the Z direction is 100 μm or less, it is possible to reduce the rigidity of the insulating layer 240, and the wiring board 200 can have sufficient flexibility. In view of the above, the thickness of the insulating layer 240 in the Z direction is more preferably 12 μm or more and 75 μm or less.

Next, the insulating layer 251 will be described in detail. A plastic and/or an insulating resin can be used as the insulating layer 251. Examples of the plastic used for the insulating layer 251 include a so-called engineering plastic. That is, examples of a plastic used for the insulating layer 251 include: polypropylene, cross-linked polyethylene, polyester, polybenzimidazole, polyamide, polyimide resin, polyimide resin amide, and polyetherimide. Examples of a plastic used for the insulating layer 251 further include: polyphenylene sulfide (PPS), polyethylene naphthalate (PEN), and polyetheretherketone (PEEK). In view of cost reduction, a polyester film is preferably used. In view of flame resistance, a polyphenylene sulfide film is preferably used. If heat resistance is further required, an aramid film or a polyimide resin film is preferably used.

An insulating resin used for the insulating layer 251 may be any appropriate resin having electrical insulating properties, such as a thermosetting resin or a UV-curable resin. Examples of the thermosetting resin include: a phenol resin, an acrylic resin, an epoxy resin, a melamine resin, a silicone resin, and an acrylic modified silicone resin. Examples of the UV-curable resin include: an epoxy acrylate resin, a polyester acrylate resin, and a modified methacrylate of any of these. The resin may be cured by using any appropriate method such as thermosetting, UV curing, and electron-beam curing. As necessary, a color pigment or another additive such as a fire retardant, an antioxidant, a lubricant, a dedusting inhibitor, or a curing accelerator may be added.

Although a method of forming the insulating layer 251 is not particularly limited, coating of a plastic with an insulating resin can be performed by using the following method. For example, a plastic can be coated with a solution, in which an insulating resin is dissolved is a solvent, by using a gravure coating method, a kiss coating method, a die coating method, a blade method, a roller coating method, a knife coating method, a spray coating method, a bar coating method, a spin coating method, or a dip coating method. The solvent may be appropriately selected in accordance with the type of a resin to be used. Examples of a solvent that can be used include: a ketone solvent such as acetone, methyl ethyl ketone, or cyclohexanone; and an alcohol solvent such as methanol, ethanol, propanol, ethylene glycol, glycerin, or propylene glycol monomethyl ether. Examples of the solvent further include: an acid such as acetic acid; an amide solvent such as formamide, dimethylacetamide, or N-methylpyrrolidone; a nitrile solvent such as acetonitrile or propyronitrile; and an ester solvent such as methyl acetate or ethyl acetate. Examples of the solvent further include a carbonate solvent such as dimethylcarbonate or diethylcarbonate. In the coating process, as necessary, a heating or drying step may be performed to vaporize the solvent. Heating and drying can be performed by using a heating device and a drying device such as an infrared heater and a hot-air dryer, and the heating temperature and the drying temperature may be selected in any appropriate way.

The thickness of the insulating layer 251 in the Z direction is preferably 5 µm or more and 50 µm or less. When the thickness of the insulating layer 251 in the Z direction is 5 µm or more, the insulating layer 251 can have a sufficient strength. When the thickness of the insulating layer 251 in the Z direction is 50 µm or less, sliding performance and bending performance are improved. In view of the above, the thickness of the insulating layer 251 in the Z direction is more preferably 10 µm or more and 30 µm or less. The volume resistivity the insulating layer 251 is preferably $10^9$ Ω·cm or more, and more preferably $10^{13}$ Ω·cm or more.

Next, the insulating layer 252 will be described in detail. The insulating layer 252 is a bonding layer provided between the insulating layer 251, and the insulating layer 240 and the signal lines 22. That is, the insulating layer 252 is a hardened adhesive. The insulating layer 252 preferably has high electrical insulation ability. Examples of an adhesive used to form the insulating layer 252 include: acrylonitrile-butadiene rubber (NBR)-based adhesive, polyamide-based adhesive, polyester-based adhesive, acrylic-based adhesive, polyester polyurethane resin-based adhesive, and silicone-based adhesive.

Preferably, the insulating layer 252 can sufficiently cover each signal line 22, which is a transmission line, and is smooth. Thus, the thickness of the insulating layer 252 in the Z direction is preferably 2 µm or more and 50 µm or less. When the thickness of the insulating layer 252 is 2 µm or more, the adhesive can sufficiently fill the gaps between the signal lines 22, and can more firmly bond the signal lines 22 to the insulating layer 252. When the thickness of the insulating layer 252 is 50 µm or less, it is possible to suppress bleeding of the adhesive sideward from a space between the insulating layers 240 and 251. In view of the above, the thickness of the insulating layer 252 in the Z direction is more preferably 5 µm or more and 30 µm or less.

A method of forming the insulating layer 252 is not particularly limited. Examples of the method include: a method of bonding sheet-shaped adhesives together and hardening the adhesives, and a method of applying a liquid adhesive by using a dispenser or a printing method and hardening the adhesive by heating or irradiation with UV rays.

Next, the insulating layer 222 will be described in detail.

An insulating resin used for the insulating layer 222 may be any appropriate resin having insulating properties. Examples of the insulating resin include: a thermosetting resin; a UV-curable resin; and a coating agent including a resin solution in which a cured-film component is dispersed in a solvent. Examples of the thermosetting resin include: a phenol resin, an acrylic resin, an epoxy resin, a polyamide resin, a polyamide-imide resin, a polyimide resin, a melamine resin, a silicone resin, and an acrylic modified silicone resin. Examples of the UV-curable resin include: an epoxy acrylate resin, a polyester acrylate resin, and a modified methacrylate of any of these. Examples of the resin solution include a solution in which a polyester-urethane resin or a polyamide-imide resin is dissolved in an organic solvent. As necessary, a color pigment, a fire retardant, an antioxidant, a lubricant, a plasticizer, a viscosity modifier, a dedusting inhibitor, a curing accelerator, an inorganic filler such as silica or carbon black, an organic filler such as silicone particles or polyester particles, or another known additive may be added. Among these, a coating agent including a resin solution in which a cured-film component is dispersed in a solvent is preferable, because shrinkage of the coating agent due to a curing reaction is small and warping can be suppressed. A coating agent in which a polyamide-imide resin having flexibility and heat resistance is dissolved in a solvent is more preferable.

Any appropriate known method can be selected as a method of forming the insulating layer 222. Examples of the method include methods of forming a cured film after forming a coating of a liquid resin composition, such as bar coating, slit coating, spray coating, dot dispenser, and screen printing. Examples of the method further include a method of forming an adhesive-component layer on a known plastic film and affixing the plastic film onto the conductive layer 221 via the adhesive-component layer. As a method of forming a cured film after forming a coating film, any appropriate method suitable for the material, such as thermosetting, UV-curing, electronic-beam curing, drying by heating, vacuum heating, or the like may be selected.

In order to prevent the conductive layer 221 from coming into contact with a member around the wiring board 200, the thickness of the insulating layer 222 is preferably greater than the thickness of the conductive layer 221 in the Z direction. The thickness of the insulating layer 222 from a main surface 2211 of the conductive layer 221 in the Z direction is preferably in the range of 2 µm or more and 10 µm or less. When the thickness is 2 µm or more, it is possible to effectively prevent the conductive layer 221 from coming into contact with a member around the wiring board 200. When the thickness of the insulating layer 222 from the main surface 2211 of the conductive layer 221 in the Z direction is 10 µm or less, the flexibility of the wiring board 200 can be more effectively increased. In view of the above, the thickness of the insulating layer 222 from the main surface 2211 of the conductive layer 221 in the Z direction is preferably 3 µm or more and 7 µm or less.

Second Embodiment

Next, referring to FIGS. 3A to 3C, a wiring board 200 according to a second embodiment will be described.

Figure 3A:
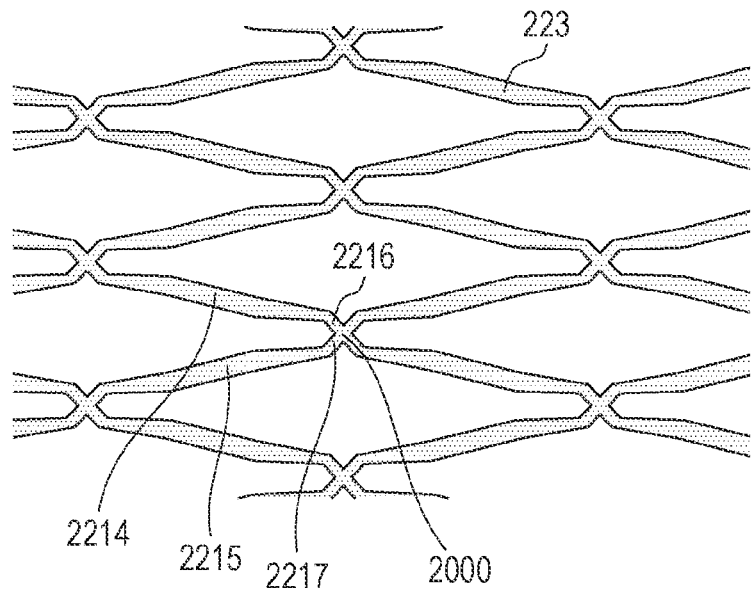
FIG. 3A illustrates only a conductive layer according to a second embodiment as seen from the main surface side of the conductive layer.
Figure 3B:
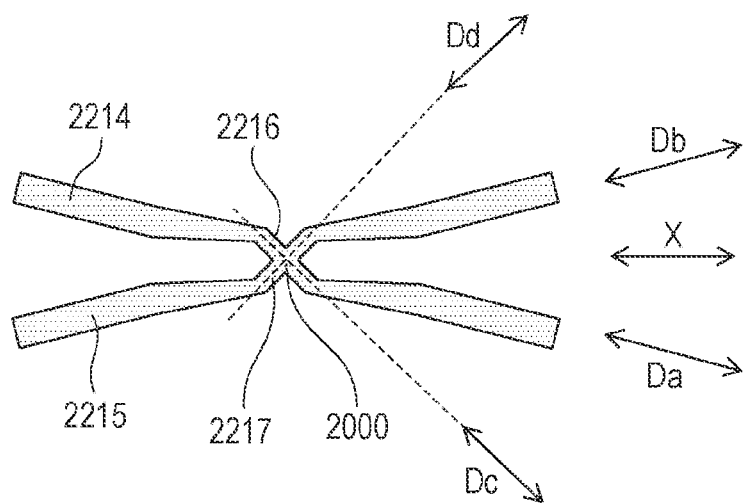
FIG. 3B is an enlarged view of a main part of FIG. 3A.
Figure 3C:
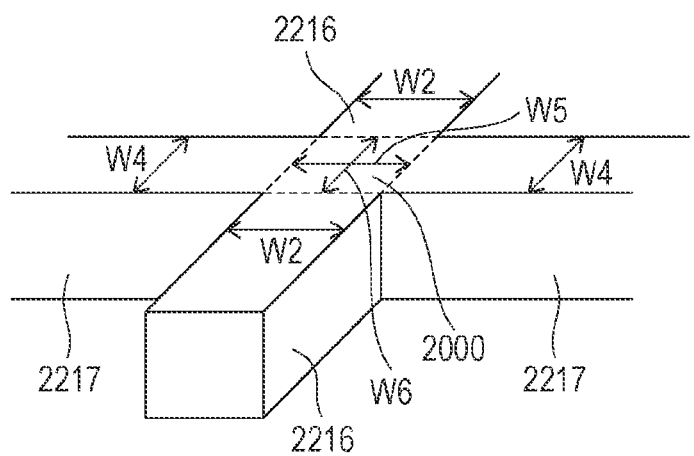
FIG. 3C is a perspective view of the conductive layer according to the second embodiment.

FIG. 3A illustrates a modification of the conductive portion 223 illustrated in FIGS. 2A to 2C, and FIG. 3B is an enlarged view of a main part of FIG. 3A. FIG. 3C is a perspective view of a conductive layer according to the second embodiment. A conductive portion 223 according to the present embodiment differs from the conductive portion 223 according to the first embodiment in the shape of a part near the intersecting region 2000 where the thin line portion 2216 and the thin line portion 2217 intersect.

That is, the conductive portion 223 according to the present embodiment differs from the conductive portion 223 according to the first embodiment in that the thin line portion 2216 and the thin line portion 2217 extend in directions that are different from the Da direction and the Db direction.

The thick-line portion 2214 is connected to the thin line portion 2216 extending in a Dc direction. The thick-line portion 2215 is connected to the thin line portion 2217 extending in a Dd direction. The acute or right angle between the Dc direction and the X direction is greater than the acute or right angle between the Da direction and the X direction. The acute or right angle between the Dd direction and the X direction is greater than the acute or right angle between the Db direction and the X direction. The acute or right angle between the X direction and the Dc direction and the acute or right angle between the X direction and the Dd direction are, for example, preferably 300 or more, and more preferably 400 or more. The acute or right angle between the X direction and the Dc direction and the acute or right angle between the X direction and the Dd direction are, for example, preferably 60° or less, and more preferably 500 or less. More preferably, the acute angle between the X direction and the Dc direction and the acute angle between the X direction and the Dd direction are 45°, and the Dc direction and the Dd direction are perpendicular to each other.

When the acute or right angle between the thin line portion 2216 and the thin line portion 2217 is within the aforementioned range, it is possible to reduce transmission error of a digital signal transmitted through the signal lines 22. Here, a case where the acute or right angle between the Dc direction and the Dd direction is greater than the acute or right angle between the Da direction and the Db direction has been described. However, it is sufficient that the acute or right angle between the Dc direction and the Dd direction is different from the acute or right angle between the Da direction and the Db direction.

In the present embodiment, the line width W1 of the thick-line portion 2214 is greater than the line width W2 of the thin line portion 2216. The line width W3 of the thick-line portion 2215 is greater than the line width W4 of the thin line portion 2217. However, provided that the acute angle between the X direction and the Dc direction and the acute angle between the X direction and the Dd direction are within the aforementioned ranges, it is possible to reduce transmission error.

Third Embodiment

Next, referring to FIGS. 4A and 4B, a third embodiment will be described.

Figure 4A:
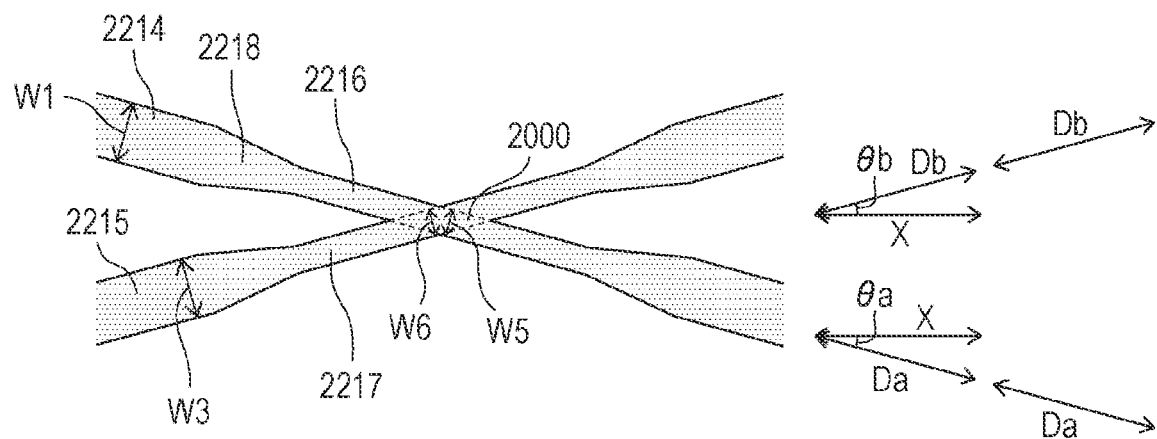
FIG. 4A is an enlarged view of an intersecting part of a conductive portion of a conductive layer according to a third embodiment.
Figure 4B:
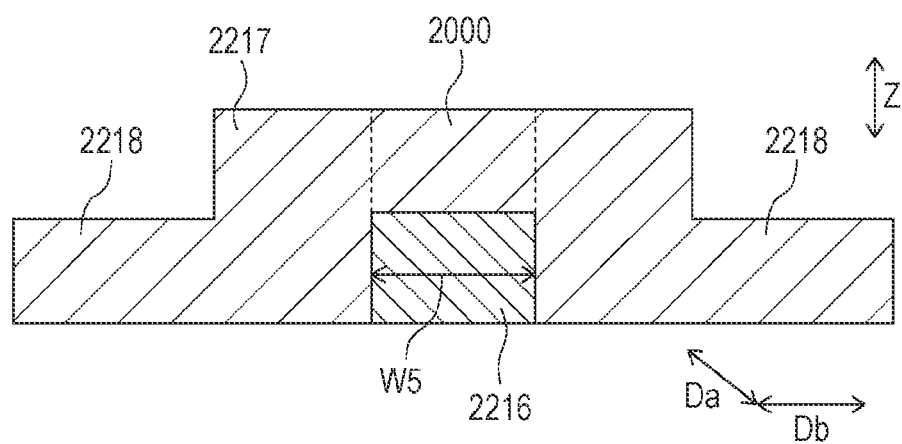
FIG. 4B is a sectional view of the interesting part of FIG. 4A.

FIG. 4A is an enlarged view of an intersecting part of the conductive portion 223 of the wiring board 200 according to the present embodiment, and FIG. 4B is a sectional view of the interesting part of FIG. 4A.

The present embodiment differs from the first embodiment in that the thin line portion 2217 intersects the thin line portion 2216 so as to extend over the thin line portion 2216. Here, a region where the thin line portion 2216 and the thin line portion 2217 do not intersect is a non-intersecting region 2218 and a region where the thin line portion 2216 and the thin line portion 2217 intersect is the intersecting region 2000. The non-intersecting region 2218 is a first region, and the intersecting region 2000 is a second region. The intersecting region 2000 is a region of the thin line portion 2216 that intersects the thin line portion 2217 and is a region of the thin line portion 2217 that intersects the thin line portion 2216.

In the case where the thin line portion 2217 intersects the thin line portion 2216 so as to extend over the thin line portion 2216, a lower layer is the thin line portion 2216 and an upper layer is the thin line portion 2217, and the line width W5 of the thin line portion 2216 is a line width in the intersecting region 2000 where the thin line portion 2216 and the thin line portion 2217 intersect. The lower layer may be the thin line portion 2217, and the upper layer may be the thin line portion 2216. Likewise, the line width W6 of the thin line portion 2217 is a line width in the intersecting region 2000 where the thin line portion 2217 and the thin line portion 2216 intersect. A line width in the intersecting region 2000 is, as shown by a dotted line in FIG. 4A, a line width when the thin line portion 2216 or the thin line portion 2217 are respectively extended in the Da direction and the Db direction. For example, the line width W5 of the thin line portion 2216 in the intersecting region 2000 corresponds to the interval between the non-intersecting region 2218 of the thin line portion 2217 and the non-intersecting region 2218 across the intersecting region 2000. The line width W6 of the thin line portion 2217 in the intersecting region 2000 corresponds to the interval between the non-intersecting region 2218 of the thin line portion 2216 and the non-intersecting region 2218 across the intersecting region 2000.

A line width in the non-intersecting region 2218 is a line width in a region other than the intersecting region 2000, and is, for example, the line width W1 or W3 in FIG. 4A.

As illustrated in FIG. 4A, the line width W5 and W6 are smaller than the line widths W1 and W2. Thus, the area of the intersecting region 2000 in plan view is small, and flexibility can be improved within a range such that transmission error may not occur.

In the present embodiment, the thin line portion 2217 intersects the thin line portion 2216 so as to extend over the thin line portion 2216. However, the thin line portion 2216 may intersect the thin line portion 2217 so as to extend over the thin line portion 2217.

Fourth Embodiment

Figure 5A:
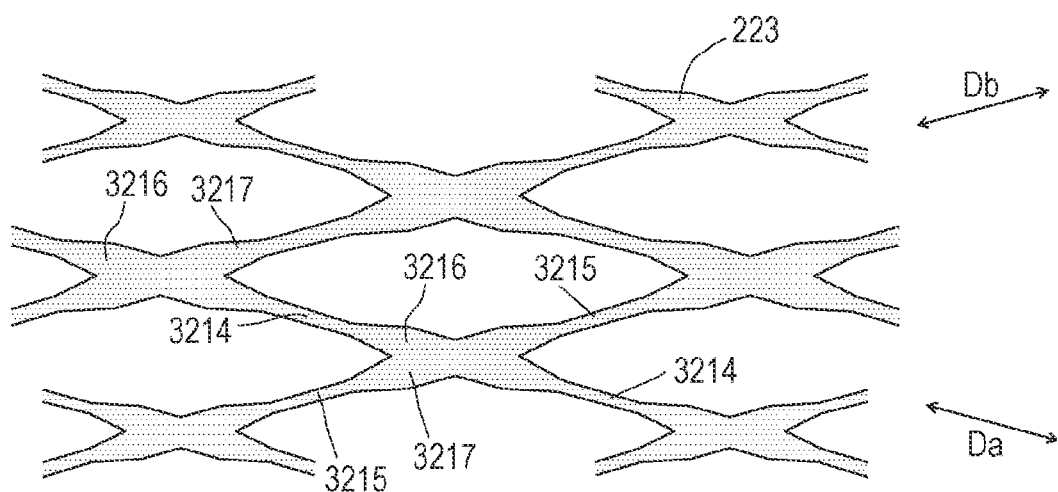
FIG. 5A illustrates only a conductive layer according to a fourth embodiment.

Next, referring to FIGS. 5A and 5B, a fourth embodiment will be described. FIG. 5A illustrates only a conductive portion 223 according to the present embodiment, and FIG. 5B is an enlarged view of an intersecting part of the conductive portion 223 of a wiring board 200 according to the present embodiment.

The present embodiment differs from the first embodiment in that a thick-line portion 3216 connected to a thin line portion 3214 and a thick-line portion 3217 connected to a thin line portion 3215 intersect. Also in the present embodiment, as with the first embodiment, the thin line portion 3214 and the thick-line portion 3216 are alternately arranged, and the thin line portion 3215 and the thick-line portion 3217 are also alternately arranged. That is, the thick-line portion 3216 is provided between two thin line portions 3214, and the thick-line portion 3217 is provided between two thin line portions 3215.

Here, an example in which the thick-line portion 3216 and the thick-line portion 3217 intersect is described. However, in a case where the thick-line portion 3216 is provided between two thin line portions 3214, the line width W10 of the thick-line portion 3217 need not be greater than the line width W8 of the thin line portion 3215, and the line width W10 may be the same as the line width W8 or smaller than the line width W8. Likewise, in a case where the thick-line portion 3217 is provided between two thin line portions 3215, the line width W9 of the thick-line portion 3216 need not be greater than the line width W7 of the thin line portion 3214, and the line width W9 may be the same as or smaller than the line width W7.

Figure 5B:
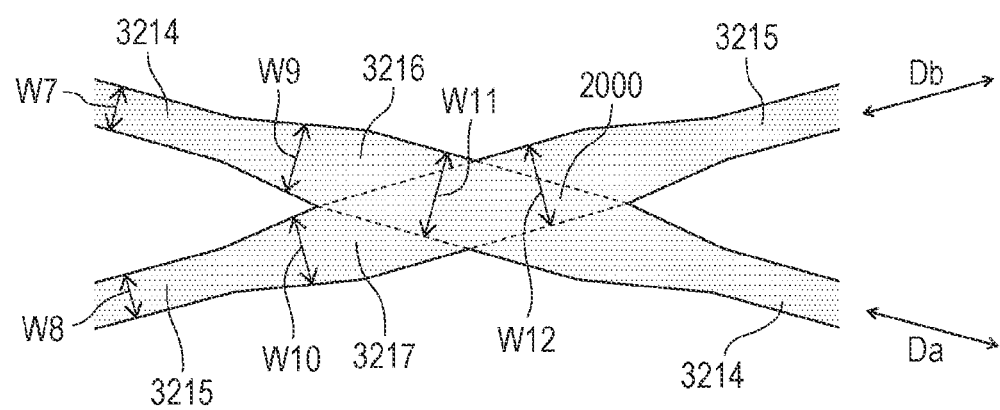
FIG. 5B is an enlarged view of a main part of FIG. 5A.

Here, as illustrated in FIG. 5B, the line width W11 of the thick-line portion 3216 in the intersecting region 2000 can be defined as the line with of an imaginary line that connects one of the thick-line portions 3216 to the other thick-line portion 3216. Likewise, as illustrated in FIG. 5B, the line width W12 of the thick-line portion 3217 in the intersecting region 2000 can be defined as the line with of an imaginary line that connects one of the thick-line portions 3217 to the other thick-line portion 3217.

By configuring the conductive portion 223 as in the present embodiment, it is possible to sufficiently block electromagnetic noise compared with the first embodiment, and it is also possible to suppress occurrence of line breakage when the wiring board 200 is bent.

EXAMPLES

Next, Example and Comparative Example will be described. A flexible printed wiring board according to Example corresponds to the wiring board 200 according to the embodiment described above. Hereafter, the flexibility and the transmission characteristics of the flexible printed wiring board according to Example and a flexible printed wiring board according to Comparative Example will be evaluated.

For each of Example and Comparative Example, a single-sided flexible printed wiring board having a length of 150 mm in the X direction and a width of 20 mm in the Y direction and including twenty sets of differential signal lines was used.

(1) Bending Load

The flexibility of each of a flexible printed wiring board according to Example and a flexible printed wiring board according to Comparative Example was evaluated based on a reactional load when being bent.

Figure 6A:
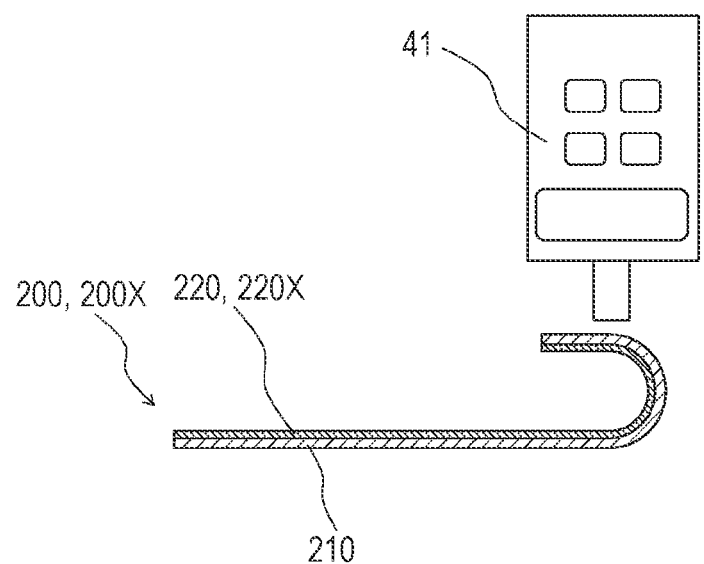
FIG. 6A is a schematic view of a device that was used to evaluate the flexibility of a flexible printed wiring board according to Example and a flexible printed wiring board according to Comparative Example.

FIG. 6A is a schematic view of a device that was used to evaluate the flexibility of a wiring board 200 according to Example and a wiring board 200X according to Comparative Example. The wiring board 200 according to Example included a wiring board body 210 and a shield member 220. The wiring board 200X according to Comparative Example included a wiring board body 210 and a shield member 220X.

As illustrated in FIG. 6A, the wiring boards 200 and 200X were horizontally disposed so that the shield members 220 and 220X were located inside. A repulsive force in the vertical direction that was generated when one end of each of the wiring boards 200 and 200X in the longitudinal direction was bent by 180 degrees with a curvature of 3 mm was measured by using a digital force gauge 41, which was "ZTA-2N" made by Imada Co., Ltd.

A bending load is an indicator for quantitatively evaluating the flexibility of a flexible printed wiring board. In general, as the bending load of a flexible printed wiring board increases, the flexibility of the flexible printed wiring board decreases, that is, the flexible printed wiring board becomes more rigid and stiffer. In general, as the flexibility of a flexible printed wiring board decreases, it becomes more difficult to attach the flexible printed wiring board to a rigid printed wiring board. Moreover, in a case where the flexible printed wiring board is connected to two circuit boards (rigid printed wiring boards), when moving one of the circuit boards (rigid printed wiring boards) relative to the other circuit board, the movement is obstructed due to low flexibility.

The bending load was evaluated in three grades: "A", "B", and "C" as follows. "A" corresponds to a bending load of less than 110 mN. "B" corresponds to a bending load of 110 mN or more and less than 130 mN. "C" corresponds to a bending load of 130 mN or more. Regarding the bending load, "B" is better than "C", and "A" is better than "B".

(2) Transmission Characteristics (Eye Pattern)

Figure 6B:
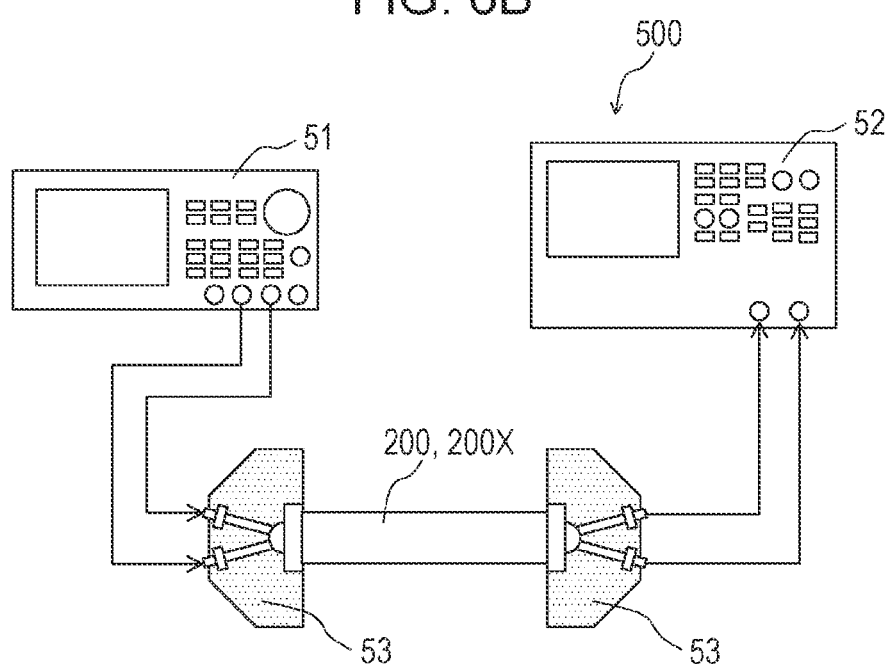
FIG. 6B is a schematic view of a system that was used to evaluate the transmission characteristics of the flexible printed wiring board according to Example and the flexible printed wiring board according to Comparative Example.

FIG. 6B is a schematic view of a system 500 that was used to evaluate the transmission characteristics of the wiring board 200 according to Example and the wiring board 200X according to Comparative Example. The system 500 consisted of a signal generator 51 ("M8041A" made by Agilent Technologies Inc.), an oscilloscope 52 ("92504A" made by Agilent Technologies Inc.), and a pair of connection substrates 53. Each connection substrate 53 had a pair of terminals through which signals could be input and output.

Each of the wiring board 200 according to Example and the wiring board 200X according to Comparative Example were connected, in a state of being unsupported in the air, to the pair of connection substrates 53. The signal generator 51 was connected to one of the connection substrates 53, and a pseudo-random signal of PRBS23 having a bit rate of 5.3 Gbps was input to the one of the connection substrate 53. The amplitude of a signal input to each terminal of the one of the connection substrates 53 was 150 mV/side. That is, the amplitude of a differential signal input to a pair of terminals of the one of the connection substrates 53 was 300 mV. The oscilloscope 52 was connected to the other connection substrate 53. By using the oscilloscope 52, the opening amplitude of an eye pattern of a signal output from the other connection substrate 53 was observed. The opening amplitude of the eye pattern was measured in an atmosphere having a temperature of 25° C. and a relative humidity in the range of 30 to 50%.

The transmission characteristics, that is, the opening amplitude of the eye pattern was evaluated as follows in three grades: "A", "B", and "C". "A" corresponds to an opening amplitude of 140 mV or more. "B" corresponds to an opening amplitude of 130 mV or more and less than 140 mV. "C" corresponds to an opening amplitude of less than 130 mV. In transmission characteristics, "B" is better than "C", and "A" is better than "B".

Example 1

The conductive layer 221, which was an electromagnetic noise shield layer, was formed on the insulating layer 251 of the wiring board body 210. The conductive layer 221 was formed by printing a silver paste made by Kyoto Elex Co., Ltd. (product name: "DD-1630L-245") on the main surface 231 of the insulating layer 251 by using a screen printer ("MT-320T" made by Micro-tec Co., Ltd.) under a condition such that the thickness of the silver paste was in the range of 3 to 6 μm.

Figure 7A:
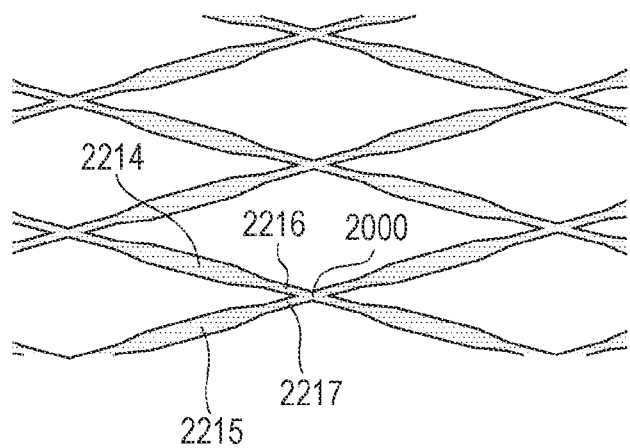
FIG. 7A illustrates only a conductive layer according to Example 1 as seen from the main surface side of the conductive layer.

As illustrated in FIG. 7A, the conductive layer 221 according to Example 1 had a mesh conductor pattern in which two parallel lines intersecting each other were each narrowed in a region near intersections. The opening ratio of the conductive layer 221 was 82%. The length of the first line segment L1 was 2.1 mm. The length of the second line segment L2 was 0.5 mm. The acute angle between the Da direction and the X direction was 3 degrees. The line width W1 was 65 μm. The line width W2 was 35 μm. The thickness of the conductive layer 221 was 5 μm.

The insulating layer 222 was formed on the conductive layer 221. The insulating layer 222 was formed from a polyamide-imide coating agent made by Toyobo Co. (product name: "HR-16NN") by using a slit coater ("SHOTMASTER 300Ω X" made by Musashi Engineering, Inc.). The thickness of the insulating layer 222 according to Example 1 was 6 μm.

Example 2

In Example 2, the wiring board body 210 and the insulating layer 222 having the same configurations as those in Example 1 were used. The conductive layer 221 was formed by using the same material and the same device as those in Example 1.

Figure 7B:
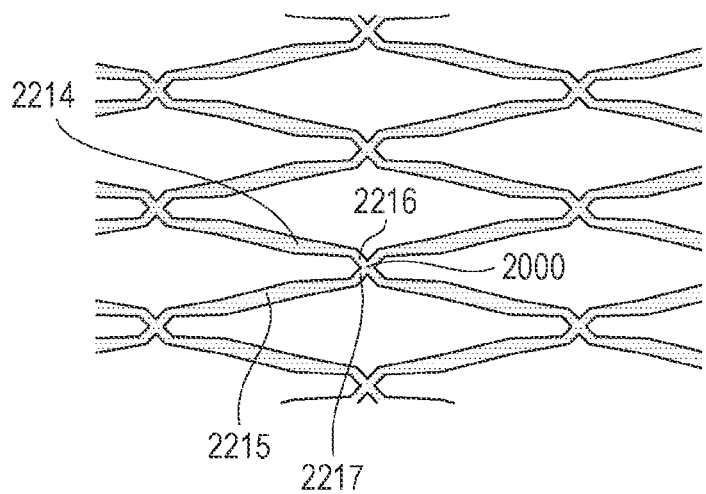
FIG. 7B illustrates only a conductive layer according to Example 2 as seen from the main surface side of the conductive layer.

The conductive layer 221 in Example 2 was the conductive layer 221 according to the second embodiment. As illustrated in FIG. 7B, the conductive layer 221 had a mesh conductor pattern such that the thick-line portion 2214 and the thick-line portion 2215 had a reduced width and were bent near the intersecting region 2000 where the thin line portion 2216 and the thin line portion 2217 intersected at right angles. The opening ratio of the conductive layer 221 was 81%. The length of the first line segment L1 was 2.2 mm. The length of the second line segment L2 was 0.5 mm. The acute angle between the Da direction and the X direction was 3 degrees. The line width W1 was 65 μm. The line width W2 was 30 μm. The thickness of the conductive layer 221 was 6 μm.

Comparative Example 1

Figure 7C:
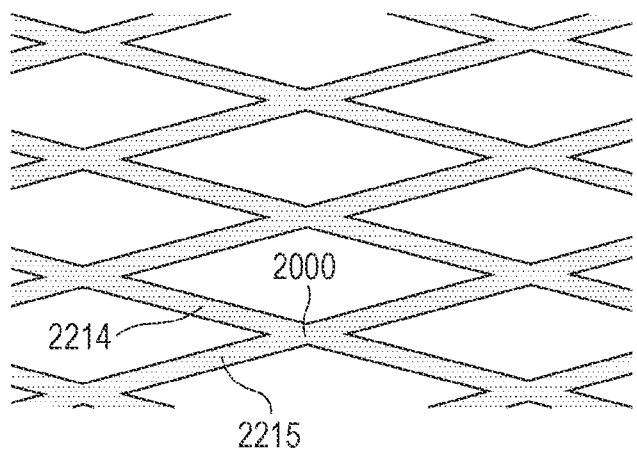
FIG. 7C illustrates only a conductive layer according to Comparative Example 1 as seen from the main surface side of the conductive layer.

Comparative Example 1 had the same configuration as Example 1, except that the conductive layer of the shield member 220X had a conductor pattern that was not thin in the intersecting part, as illustrated in FIG. 7C.

Evaluation Results

FIG. 8 is a table showing the evaluation results of Examples 1 and 2 and Comparative Example 1.

In Comparative Example 1, because the intersecting part of the conductive layer of the shield member 220X was not thin, the rigidity of the intersecting part is high, and, as a whole, the bending load, that is, the flexibility was impaired.

In contrast, in Examples 1 and 2, the bending load of the wiring board 200 was small, and the transmission characteristics at a bit rate of 5.3 Gbps was good.

Fifth Embodiment

Figure 9:
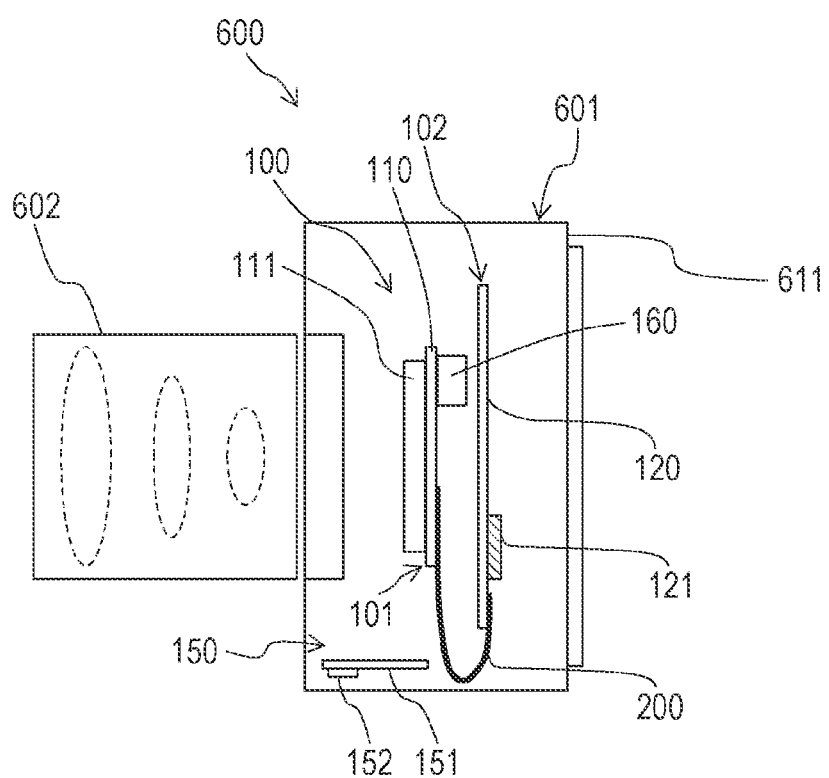
FIG. 9 illustrates a digital camera that is an imaging device as an example of an electronic apparatus according to an embodiment.

Next, referring to FIG. 9, a digital camera 600 that is an imaging device as an example of an electronic apparatus according to an embodiment will be described.

The digital camera 600 is a lens-interchangeable digital camera, and includes a camera body 601. A lens unit (lens barrel) 602, including a lens, is attachable to and removable from the camera body 601. The camera body 601 includes a housing 611, an electronic unit 100, and a wireless communication unit 150. The electronic unit 100 and the wireless communication unit 150 are accommodated in the housing 611. The electronic unit 100 of an imaging device is an imaging unit.

The electronic unit 100 includes the circuit board 101, the circuit board 102, and the wiring board 200 that electrically connects the circuit board 101 and the circuit board 102 to each other. The circuit board 101 is an example of a first circuit board. The circuit board 102 is an example of a second circuit board. By using the wiring board 200 to connect the circuit board 101 and the circuit board 102, the weight of the wiring structure can be reduced, compared with a case where a coaxial cable is used.

The circuit board 101 includes the wiring board 110 and the semiconductor device 111 mounted on the wiring board 110. The circuit board 102 includes the wiring board 120 and the semiconductor device 121 mounted on the wiring board 120. The semiconductor device 111 and the semiconductor device 121 are each an example of an electronic component mounted on the wiring boards 110 and 120. The electronic component mounted the on the wiring boards 110 and 120 may be an imaging device, an arithmetic device, a display device, a communication device, a storage device, or a power supply. The electronic component mounted on the wiring boards 110 and 120 is not limited to an active component and may be a passive component.

In the present embodiment, the semiconductor device 111 is an image sensor (imaging device). The image sensor is, for example, a complementary metal oxide semiconductor (CMOS) image sensor or a charge coupled device (CCD) image sensor. The image sensor has a function of converting light, which has entered thereinto via a lens unit 602, into an electric signal. In the present embodiment, the semiconductor device 121 is a processor (arithmetic device) such as a digital signal processor or an image signal processor. The image signal processor has a function of: obtaining an electric signal, which represents image data, from the semiconductor device 111 that is an image sensor (imaging device); correcting the obtained electric signal; and generating corrected image data. The term "imaging module" or "imaging unit" may refer to a module or unit in which the circuit board 101 connected to the wiring board 200 includes an image sensor. The imaging module is an example of an electronic module, and the imaging unit is an example of the electronic unit 100.

In the present embodiment, the electronic unit 100 includes a driving device 160 that moves the circuit board 101 (the wiring board 110 and the semiconductor device 111). The driving device 160 includes a motor that is an example of a driving source. The digital camera 600, which includes the electronic unit 100 including the driving device 160, can realize camera shake compensation (antivibration) function by moving the semiconductor device 111 via the circuit board 101. The driving source of the driving device 160 is not limited to an electromagnetic motor, and may be a piezoelectric motor, such as an ultrasonic motor, or an electrostatic motor. The wiring board 200 needs to be flexible, because the wiring board 200 is connected to the circuit board 101 that is moved as described above.

The term "electronic unit" may refer to, instead of the electronic unit 100 including the wiring board 200 and the circuit boards 101 and 102, a unit including one of the circuit board 101 and the circuit board 102 and further including the driving device 160 and other components.

In the present embodiment, the wiring board 200 is mounted in a bent state in the digital camera 600, the shield member 220 corresponds to an outer side of a curved surface, and the wiring board body 210 corresponds to an inner side of the curved surface. That is, the shield member 220 corresponds to a surface on the housing 611 side, and the wiring board body 210 corresponds to a surface on a side opposite to the housing 611 side.

The wireless communication unit 150 is a module that performs wireless communication in a GHz band. The wireless communication unit 150 includes a rigid wiring board that is an example of a wiring board 151 including an antenna (not shown) and a wireless communication IC 152 mounted on the wiring board 151. The antenna is provided in the same plane as the wireless communication IC 152, and is disposed at a position near the housing 611 so that the antenna can easily communicate with the outside. Preferably, the wireless communication IC 152 can transmit and/or receive image data via the antenna by performing wireless communication with an external apparatus such as a PC or a wireless router. In the present embodiment, the wireless communication IC 152 can receive and transmit data via the antenna. To be specific, the wireless communication IC 152 modulates a digital signal acquired from the semiconductor device 121 and representing image data, and transmits from the antenna the digital signal as an electromagnetic wave having a communication frequency in accordance with a wireless standard. The wireless communication IC 152 demodulates an electromagnetic wave received by the antenna into a digital signal representing image data. The wireless communication IC 152 performs wireless communication with an external apparatus in accordance with a standard such as Wi-Fi™ or Bluetooth™. By using the conductive portion 223, which is provided in the wiring board 200 of the electronic unit 100 as an imaging unit, as an electromagnetic shield, it is possible to suppress an electromagnetic wave emitted from the wireless communication unit 150 from generating noise in the electronic unit 100. It is also possible to use the wiring board 200 to connect the wiring board 151 to another wiring board.

The embodiments described above may be changed as appropriate within the range of the technological idea.

For example, a plurality of the embodiments may be combined. Some of the matters described in at least one of the embodiments may be removed or replaced.

A new matter may be added to at least one of the embodiments. The disclosed contents of the present specification include not only matters that are explicitly described in the present specification but also all matters that can be grasped from the present specification and the drawings attached the present specification.

The disclosed contents of the present specification include the complement of an individual concept described in the present specification. That is, when there is a description in the present specification such that "A is greater than B.", even if a description such that "A is not greater than B." is omitted, it can be said that the present specification discloses that "A is not greater than B.". This is because, when it is described that "A is greater than B.", it is presupposed that a case where "A is not greater than B." is taken into consideration.

The present disclosure can provide a technology that is advantageous for improving the functionality of a flexible wiring board.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-125005 filed Jul. 30, 2021 and No. 2022-082416 filed May 19, 2022, which are hereby incorporated by reference herein in their entirety.

What is claimed is:

1. A flexible wiring board comprising:
   a signal line; and
   a conductive portion that overlaps the signal line in plan view and includes a first line portion that extends in a first direction, and a second line portion that extends in a second direction intersecting the first direction,
   wherein the first line portion includes a first part and a second part,
   wherein the conductive portion includes a third line portion that has a line width smaller than a line width of the first part and a line width of the second part, that is connected to the first part and the second part, and that is provided between the first part and the second part,
   wherein the second line portion includes a third part and a fourth part,
   wherein the conductive portion includes a fourth line portion that is connected to the third part and the fourth part and that is provided between the third part and the fourth part, and
   wherein the third line portion and the fourth line portion intersect.

2. The flexible wiring board according to claim 1, wherein a line width of the fourth line portion is smaller than a line width of the third part and a line width of the fourth part.

3. The flexible wiring board according to claim 1, wherein the first direction and the second direction intersect a direction in which the signal line extends.

4. The flexible wiring board according to claim 1, wherein a line width of the first line portion and a line width of the second line portion are each 50 micrometers (μm) or more and 200 μm or less, and the line width of the third line portion and a line width of the fourth line portion are each 10 μm or more and less than 50 μm.

5. The flexible wiring board according to claim 1, wherein a conductive layer includes the conductive portion and is provided with an opening portion in which the conductive portion is not present, and an opening ratio of the conductive layer is 40% or more and 95% or less.

6. The flexible wiring board according to claim 1,
   wherein the conductive portion is disposed in a mesh pattern,
   wherein a conductive layer includes the conductive portion disposed in the mesh pattern and is provided with an opening portion in which the conductive portion is not present,
   wherein the conductive portion includes a fifth line portion, a seventh line portion, and a ninth line portion that extend in the first direction, and a sixth line portion, an eighth line portion, and a tenth line portion that extend in the second direction,
   wherein a first line segment is defined as a line segment that connects (i) a first center point where the third line portion and the fourth line portion intersect and (ii) a second center point that is positioned (a) across the opening portion with respect to the first center point and (b) where the fifth line portion and the sixth line portion intersect,
   wherein the fifth line portion and the sixth line portion have a line width smaller than a line width of the first line portion and a line width of the second line portion, wherein a second line segment is defined as a line segment that connects (iii) a third center point where the seventh line portion and the eighth line portion intersect and (iv) a fourth center point that is positioned (a) across the opening portion with respect to the third center point and (b) where the ninth line portion and the tenth line portion intersect, wherein the seventh line portion and the eighth line portion have a line width smaller than the line width of the first line portion and the line width of the second line portion, and the ninth line portion and the tenth line portion have a line width smaller than the line width of the first line portion and the line width of the second line portion, wherein the first line segment intersects the second line segment, and wherein the first line segment has a length that is 1.5 times a length of the second line segment or more.

7. The flexible wiring board according to claim 6, wherein a direction in which the signal line extends differs from a fifth direction in which the first line segment extends.

8. The electronic module according to claim 6,
wherein the signal line includes at least one set of differential signal lines that transmit a differential signal, and
wherein a distance from a first differential signal line to a second differential signal line adjacent to the first differential signal line is greater than the length of the second line segment.

9. A flexible wiring board comprising:
a signal line; and
a conductive portion that overlaps the signal line in plan view and includes a first line portion that extends in a first direction, a second line portion that extends in a second direction intersecting the first direction, a third line portion that extends in a third direction and that is connected to the first line portion, and a fourth line portion that extends in a fourth direction intersecting the third direction and that is connected to the second line portion,
wherein an acute or right angle between the third direction and the fourth direction differs from an acute or right angle between the first direction and the second direction.

10. The flexible wiring board according to claim 9, wherein the acute or right angle between the third direction and the fourth direction is greater than the acute or right angle between the first direction and the second direction.

11. The flexible wiring board according to claim 9, wherein a line width of the third line portion is smaller than a line width of the first line portion.

12. The flexible wiring board according to claim 11, wherein a line width of the fourth line portion is smaller than a line width of the second line portion.

13. A flexible wiring board comprising:
a signal line; and
a conductive portion that overlaps the signal line in plan view and includes a first line portion that extends in a first direction, and a second line portion that extends in a second direction intersecting the first direction,
wherein the first line portion includes a first part and a second part,
wherein the conductive portion includes a third line portion that has a line width greater than a line width of the first part and a line width of the second part, that is connected to the first part and the second part, and that is provided between the first part and the second part, wherein the second line portion includes a third part and a fourth part,
wherein the conductive portion includes a fourth line portion that is provided between the third part and the fourth part, and
wherein the third line portion and the fourth line portion intersect.

14. The flexible wiring board according to claim 13, wherein a line width of the fourth line portion is greater than a line width of the third part and a line width of the fourth part.

15. A method of manufacturing the flexible wiring board according to claim 1, the method comprising:
forming the first line portion, the second line portion, the third line portion, and the fourth line portion by screen printing.

16. An electronic module comprising:
the flexible wiring board according to claim 1;
a rigid wiring board to which an end portion of the flexible wiring board is connected; and
an electronic component mounted on the rigid wiring board.

17. The electronic module according to claim 16, wherein the electronic component includes an image sensor.

18. An electronic unit comprising:
an electronic module having the flexible wiring board according to claim 1, a rigid wiring board to which an end portion of the flexible wiring board is connected, and an electronic component mounted on the rigid wiring board; and
a driving device configured to move the rigid wiring board.

19. An electronic apparatus comprising:
an electronic module having the flexible wiring board according to claim 1, a rigid wiring board to which an end portion of the flexible wiring board is connected, and an electronic component mounted on the rigid wiring board; and
a circuit board to which another end portion, which is different from the end portion of the flexible wiring board, is connected,
wherein a processor for processing a signal that is output from the electronic component is connected to the circuit board.

20. An electronic apparatus comprising:
an electronic module having the flexible wiring board according to claim 1, a rigid wiring board to which an end portion of the flexible wiring board is connected, and an electronic component mounted on the rigid wiring board; and
a housing that accommodates the electronic module,
wherein the flexible wiring board is accommodated in the housing in a state in which the flexible wiring board is bent, and
wherein the conductive portion is provided on an outer surface of the flexible wiring board, where the outer surface is one of bent surfaces of the flexible wiring board.

21. An electronic module comprising:
the flexible wiring board according to claim 9;
a rigid wiring board to which an end portion of the flexible wiring board is connected; and
an electronic component mounted on the rigid wiring board.

22. The electronic module according to claim 21, wherein the electronic component includes an image sensor.

23. An electronic unit comprising:

an electronic module having the flexible wiring board according to claim 9, a rigid wiring board to which an end portion of the flexible wiring board is connected, and an electronic component mounted on the rigid wiring board; and a driving device configured to move the rigid wiring board.

24. An electronic apparatus comprising:

an electronic module having the flexible wiring board according to claim 9, a rigid wiring board to which an end portion of the flexible wiring board is connected, and an electronic component mounted on the rigid wiring board; and a circuit board to which another end portion, which is different from the end portion of the flexible wiring board, is connected, wherein a processor for processing a signal that is output from the electronic component is connected to the circuit board.

25. An electronic apparatus comprising:

an electronic module having the flexible wiring board according to claim 9, a rigid wiring board to which an end portion of the flexible wiring board is connected, and an electronic component mounted on the rigid wiring board; and a housing that accommodates the electronic module, wherein the flexible wiring board is accommodated in the housing in a state in which the flexible wiring board is bent, and wherein the conductive portion is provided on an outer surface of the flexible wiring board, where the outer surface is one of bent surfaces of the flexible wiring board.

* * * * *